United States Patent
Kokubun

(10) Patent No.: US 8,541,858 B2
(45) Date of Patent: Sep. 24, 2013

(54) SOLID STATE IMAGING DEVICE

(75) Inventor: Koichi Kokubun, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 368 days.

(21) Appl. No.: 13/052,297

(22) Filed: Mar. 21, 2011

(65) Prior Publication Data

US 2011/0272772 A1 Nov. 10, 2011

(30) Foreign Application Priority Data

May 6, 2010 (JP) ................................. 2010-106482

(51) Int. Cl.
*H01L 31/0232* (2006.01)

(52) U.S. Cl.
USPC ........... 257/432; 257/291; 257/294; 257/440; 438/70

(58) Field of Classification Search
USPC .................... 438/70; 257/291, 294, 432, 440
See application file for complete search history.

(56) References Cited

U.S. PATENT DOCUMENTS

| | | | | |
|---|---|---|---|---|
| 7,411,620 B2 * | 8/2008 | Taniguchi et al. | ............ | 348/294 |
| 7,586,528 B2 * | 9/2009 | Fukunaga et al. | ............ | 348/274 |
| 7,667,750 B2 * | 2/2010 | Goto et al. | ............ | 348/273 |
| 7,741,689 B2 * | 6/2010 | Miyashita et al. | ............ | 257/435 |
| 2005/0205879 A1 * | 9/2005 | Fukunaga | ............ | 257/80 |
| 2007/0057954 A1 * | 3/2007 | Imamura et al. | ............ | 345/532 |
| 2008/0135828 A1 * | 6/2008 | Fukunaga | ............ | 257/12 |
| 2009/0303359 A1 * | 12/2009 | Otsuka et al. | ............ | 348/280 |
| 2011/0215433 A1 | 9/2011 | Kokubun | | |

FOREIGN PATENT DOCUMENTS

| | | |
|---|---|---|
| JP | 2005-303266 | 10/2005 |
| JP | 2006-210497 | 8/2006 |
| JP | 2007-219515 | 8/2007 |
| JP | 2007-317750 | 12/2007 |
| JP | 2007-335760 | 12/2007 |
| JP | 2008-134610 | 6/2008 |

* cited by examiner

*Primary Examiner* — Jarrett Stark
*Assistant Examiner* — Nicholas Tobergte
(74) *Attorney, Agent, or Firm* — White & Case LLP

(57) ABSTRACT

A solid state imaging device includes: a first photoelectric conversion layer of an organic material; a second photoelectric conversion layer of an inorganic material; a third photoelectric conversion layer of an inorganic material; a first filter of an inorganic material; a second filter of an inorganic material. The first photoelectric conversion layer photoelectrically-converts a light of a first color. The first filter is disposed between the first photoelectric conversion layer and the second photoelectric conversion layer to selectively guide a light of a second color, out of a light that passed through the first photoelectric conversion layer, to the second photoelectric conversion layer. The second filter being disposed between the first photoelectric conversion layer and the third photoelectric conversion layer to selectively guide a light of a third color, out of the light that passed through the first photoelectric conversion layer, to the third photoelectric conversion layer.

20 Claims, 5 Drawing Sheets

SOLID STATE IMAGING DEVICE

CROSS-REFERENCE TO RELATED APPLICATIONS

This application is based upon and claims the benefit of priority from the prior Japanese Patent Application No. 2010-106482, filed on May 6, 2010; the entire contents of which are incorporated herein by reference.

FIELD

Embodiments described herein relate generally to a solid state imaging device.

BACKGROUND

Japanese Patent Application Laid-Open (JP-A) No. 2005-303266 discloses a solid state imaging element having the structure of a BGR three-layered laminate in which photoelectric conversion films are laminated, including a B film having a function of absorbing the light of wavelengths of a blue color, a G film having a function of absorbing the light of wavelengths of a green color, and a R film having a function of absorbing the light of wavelengths of a red color. Each of the B, G, and R films is an organic film containing an organic dye therein. According to JP-A No. 2005-303266, use of an organic dye in each photoelectric conversion film allows obtainment of a high sensitivity, omission of an IR filter, and reduction in area.

In this solid state imaging element having the structure of a BGR three-layered laminate, it is necessary to form holes that pass through the G film and the R film in order to form plugs used to transmit a signal charge of the uppermost film (B film) to a semiconductor layer. For this case, since both the G film and the R film are an organic film, it is problematic to apply microfabrication processing thereto, so that it is difficult to reduce the size of the holes that pass through the films.

DETAILED DESCRIPTION

In general, according to one embodiment, a solid state imaging device includes: a first photoelectric conversion layer of an organic material; a second photoelectric conversion layer of an inorganic material; a third photoelectric conversion layer of an inorganic material; a first filter of an inorganic material; a second filter of an inorganic material. The first photoelectric conversion layer photoelectrically-converts a light of a first color. The third photoelectric conversion layer is disposed adjacent to the second photoelectric conversion layer in terms of a direction along the first photoelectric conversion layer. The first filter is disposed between the first photoelectric conversion layer and the second photoelectric conversion layer to selectively guide a light of a second color, out of a light that has passed through the first photoelectric conversion layer, to the second photoelectric conversion layer. The second filter being disposed between the first photoelectric conversion layer and the third photoelectric conversion layer to selectively guide a light of a third color, out of the light that has passed through the first photoelectric conversion layer, to the third photoelectric conversion layer.

Exemplary embodiments of a solid state imaging device will be explained below in detail with reference to the accompanying drawings. The present invention is not limited to the following embodiments.

Exemplary Embodiment

Figure 1:
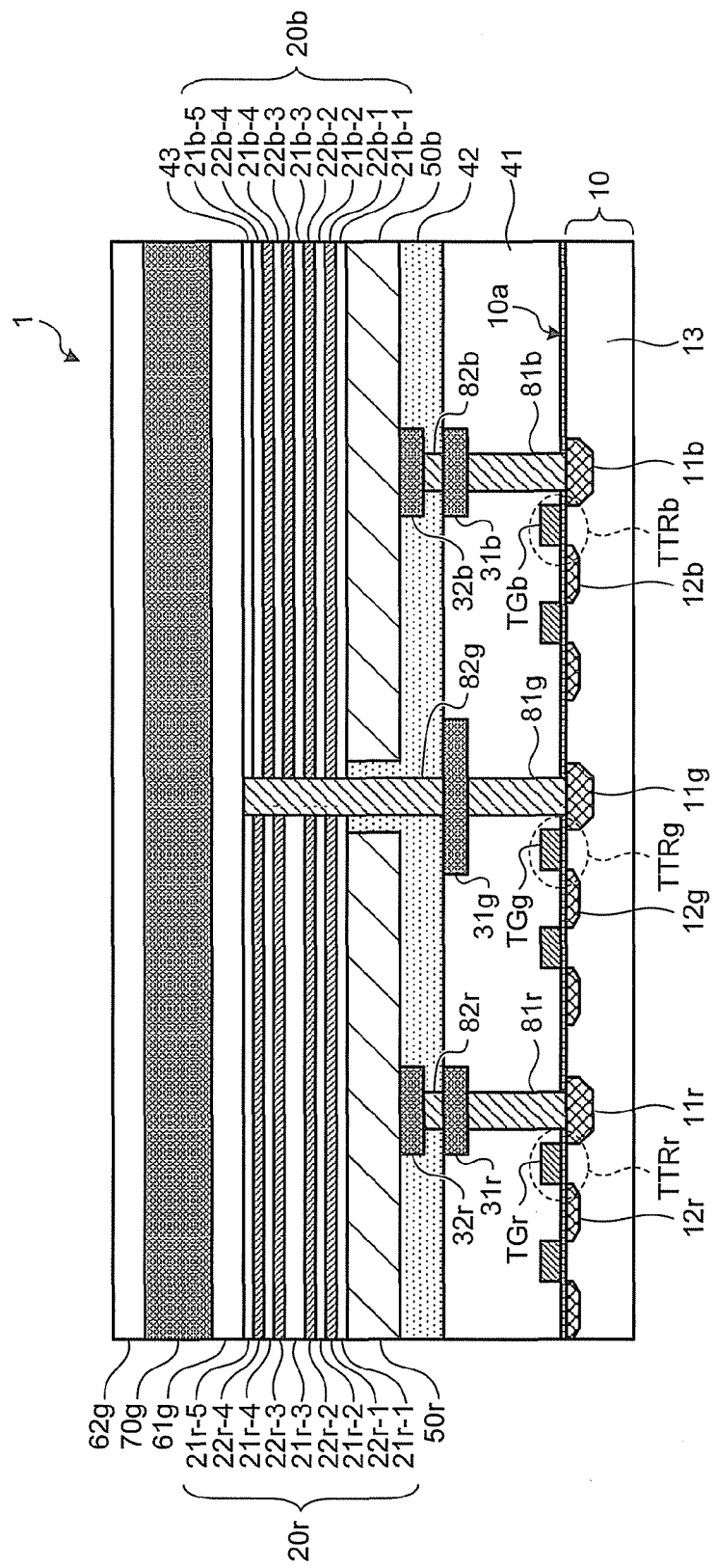
FIG. 1 is a diagram illustrating the configuration of a solid state imaging device according to an exemplary embodiment of the invention.

The configuration of a solid state imaging device 1 according to an exemplary embodiment of the invention will be described with reference to FIG. 1. FIG. 1 illustrates the sectional configuration of the solid state imaging device 1, particularly for one pixel present in an imaging region with a plurality of pixels arranged therein.

The solid state imaging device 1 includes: a semiconductor substrate 10; gate electrodes TGr, TGb, and TGb; an insulation film 41; a conductive pattern 31r; a conductive pattern 31g; a conductive pattern 31b; an insulation film 42; a photo-electric conversion layer (second photo-electric conversion layer) 50r; a photo-electric conversion layer (third photo-electric conversion layer) 50b; a color filter (first filter) 20r; a color filter (second filter) 20b; an insulation film 43; a pixel electrode film 61g; a photo-electric conversion layer (first photo-electric conversion layer) 70g; a common electrode film 62g; contact plugs 81r and 82r; contact plugs 81g and 82g; and contact plugs 81b and 82b.

In the semiconductor substrate 10, storage diodes 11r, 11g, and 11b and floating diffusions 12r, 12g, and 12b are arranged in a well region 13. The well region 13 is formed of a semiconductor material (for example, silicon) that contains impurities having a first conductivity type (for example, P type) therein at a low concentration. An example of the P type impurity includes boron. The storage diodes 11r, 11g, and 11b and the floating diffusions 12r, 12g, and 12b are formed with use of a semiconductor material (for example, silicon) that contains impurities having a second conductivity (for example, N type) opposite to the first conductivity type at a high concentration as compared with the concentration of the first conductivity type impurities contained in the well region 13. Examples of the N type impurities include phosphorous and arsenic.

On the semiconductor substrate 10, gate electrodes are arranged, including the gate electrodes TGr, TGg, and TGb and other gate electrodes. The gate electrodes TGr, TGg, and TGb are disposed on the semiconductor substrate 10, in particular between the storage diodes 11r, 11g, 11b and the floating diffusion regions 12r, 12g, and 12b, respectively. These structures form transfer transistors TTRr, TTRg, and TTRb.

That is, the storage diodes 11r, 11g, and 11b function to store electric charges transmitted via contact plugs 81b, 81r, and 81g therein. The transfer transistors TTRr, TTRg, and TTRb are turned on when a control signal having an active level is supplied to the gate electrodes TGr, TGg, and TGb.

With such operation, the transfer transistors TTRr, TTRg, and TTRb transmit charges accumulated in the storage diodes 11r, 11g, 11b to the floating diffusions 12r, 12g, and 12b, respectively. The floating diffusions 12r, 12g, and 12b convert the transmitted charges into voltages. An amplifying transistor (not shown) outputs a signal according to the voltage resulting from the conversion, to a signal line.

The insulation film 41 covers the semiconductor substrate 10 and the gate electrodes TGr, TGg, and TGb. The contact plugs 81r, 81g, and 81b pass through the insulation film 41.

The conductive pattern 31r is connected to the storage diode 11r via the contact plug 81r. The conductive pattern 31g is connected to the storage diode 11g via the contact plug 81g. The conductive pattern 31b is connected to the storage diode 11b via the contact plug 81b. All the conductive patterns 31r, 31g, and 31b are made of, for example, a metal or an intermetallic compound. Each of the conductive patterns 31r, 31g, and 31b may have a damascene structure in which a conductive pattern is buried in a groove formed in the insulation film 41 shown in FIG. 1. Alternatively, it may have a structure of a pattern formed on the insulation film 41 through deposition and patterning. In addition, the conductive patterns 31r, 31g, and 31b may be patterned on the semiconductor substrate 10a to shield a predetermined region of the semiconductor substrate 10a from light.

The insulation film 42 covers the insulation film 41 and the conductive patterns 31r, 31g, and 31b. In the insulation film 42, contact plugs 82r, 82g, and 82b are formed to pass through. The insulation film 42 extends between a photoelectric conversion layer 50r and a contact plug 82g, and also extends between a photo-electric conversion layer 50b and a contact plug 82g. With this structure, the insulation film 42 electrically insulates the photo-electric conversion layer 50r and the photo-electric conversion layer 50b from each other, and also electrically insulates the photo-electric conversion layer 50r and the photo-electric conversion layer 50b from the contact plug 82g.

The conductive pattern 32r serves as a pixel electrode for collecting an electric charge generated in the photo-electric conversion layer 50r. The conductive pattern 32r is connected to the conductive pattern 31r via the contact plug 82r. The conductive pattern 32b serves as a pixel electrode for collecting an electric charge generated in the photo-electric conversion layer 50b. The conductive pattern 32b is connected to the conductive pattern 31b via the contact plug 82b. Both the conductive pattern 32r and the conductive pattern 32b are made of, for example, a metal or an intermetallic compound. Each of the conductive patterns 32r and 32b may have a damascene structure in which conductive patterns are buried in grooves formed in the insulation film 42 shown in FIG. 1. Alternatively, it may have a structure of a pattern formed on the insulation film 42 through deposition of a film on the insulation film 42 and the subsequent patterning of the film.

The photo-electric conversion layer 50r is arranged next to the photo-electric conversion layer 50b, in terms of a direction along the photo-electric conversion layer 70g. The photo-electric conversion layer 50r covers the conductive pattern 32r and the insulation film 42. The photo-electric conversion layer 50r is electrically insulated not only from the contact plug 82g but also from the photo-electric conversion layer 50b due to the insulation film 42 interposed therebetween. The photo-electric conversion layer 50r absorbs the light of wavelengths in a red color range which has passed through the color filter 20r, and generates an electric charge according to the absorbed light. The photo-electric conversion layer 50r is an inorganic photo-electric conversion layer and is made of the same material as that of the photo-electric conversion layer 50b. That is, the photo-electric conversion layer 50r may be formed with use of an inorganic material having a property of absorbing the light of wavelengths in any range including a red color range and a blue color range. For example, the photo-electric conversion layer 50r may be made of an inorganic material having a property of absorbing the light of wavelengths in a wavelength range of visible light. For this case, the photo-electric conversion layer 50r can serve as a light shielding film that shields the surface of the semiconductor substrate 10 from light.

The photo-electric conversion layer 50r can be formed with use of a material mainly containing a component selected from the group consisting of silicon, cadmium sulfide, cadmium selenide, lead sulfide, and lead selenide. The photo-electric conversion layer 50r can be a monocrystalline, polycrystalline, or amorphous layer containing the main component. The photo-electric conversion layer 50r may be a photodiode layer including a P type layer and an N type layer.

The photo-electric conversion layer 50b is arranged next to the photo-electric conversion layer 50r, in terms of a direction along the photo-electric conversion layer 70g. The photo-electric conversion layer 50b covers the conductive pattern 32b and the insulation film 42. The photo-electric conversion layer 50b is electrically insulated not only from the contact plug 82g but also from the photo-electric conversion layer 50r due to the insulation film 42 interposed therebetween. The photo-electric conversion layer 50b absorbs the light of wavelengths in a blue color range which has passed through the color filter 20b, and generates an electric charge according to the absorbed light. The photo-electric conversion layer 50b is an inorganic photo-electric conversion layer and is made of the same material as the photo-electric conversion layer 50r. That is, the photo-electric conversion layer 50b may be made of an inorganic material having a property of absorbing the light of wavelengths in any range including a red color range and a blue color range. For example, the photo-electric conversion layer 50b may be made of an inorganic material having a property of absorbing the light of wavelengths in the whole wavelength range of visible light. In such a case, the photo-electric conversion layer 50b can serve as a light shielding film that shields the surface of the semiconductor substrate 10 from light.

The photo-electric conversion layer 50b can be formed with use of a material mainly containing a component, as a main component, selected from the group consisting of silicon, cadmium sulfide, cadmium selenide, lead sulfide, and lead selenide. The photo-electric conversion layer 50r can be a monocrystalline, polycrystalline, or amorphous layer containing the main component. The photo-electric conversion layer 50b may be structured in the form of a photodiode including a P type layer and an N type layer.

The color filter 20r is disposed between the photo-electric conversion layer 70g and the photo-electric conversion layer 50r. With such an arrangement, the color filter 20r selectively guides the light of wavelengths in a red color range, out of the light that has passed through the photo-electric conversion layer 70g (for example, the light that lacks a light component of wavelengths in a green color wavelength range due to the absorption), up to the photo-electric conversion layer 50. The color filter 20r is made of an inorganic material. The color filter 20r is, for example, a red filter of a photonic crystal type which is a laminate of inorganic materials (low refractive index materials and high refractive index materials).

In more detail, in the color filter 20r, first insulation layers 21r-1, 21r-2, 21r-3, 21r-4, and 21r-5 and second insulation layers 22r-1, 22r-2, 22r-3, and 22r-4 are laminated more than two times alternately. The refractive index of the second insulation layers 22r-1 to 22r-4 is lower than the refractive index of first insulation layers 21r-1 to 21r-5. The first insulation layers 21r-1 to 21r-5 are made of, for example, titanium oxide ($TiO_2$, a refractive index of 2.5). The second insulation layers 22r-1 to 22r-4 are made of silicon oxide ($SiO2$, a refractive index of 1.45).

The second insulation layers 22r-1 to 22r-4 have the film thicknesses similar to each other. The first insulation layers 21r-1, 21r-2, 21r-4, and 21r-5 have the film thicknesses similar to each other. Meanwhile, the film thickness of the first insulation layer 21r-3 is larger than the film thickness of each of other first insulation layers 21r-1, 21r-2, 21r-4, and 21r-5. This first insulation layer 21r-3 will be also referred to as, in particular, a spacer layer 21r-3 below.

The color filter 20b is disposed between the photo-electric conversion layer 70g and the photo-electric conversion layer 50b. Thanks to this arrangement, the color filter 20b selectively guides the light of wavelengths in a blue color range, out of the light that has passed through the photo-electric conversion layer 70g (that is, the light that lacks a light component of wavelengths in a green color wavelength range due to absorption), up to the photo-electric conversion layer 50b. The color filter 20b is made of an inorganic material. The color filter 20b is, for example, a blue filter of a photonic crystal type in which inorganic materials (low refractive index materials and high refractive index materials) are laminated.

In more detail, in the color filter 20b, first insulation layers 21b-1, 21b-2, 21b-3, 21b-4, and 21b-5 and second insulation layers 22b-1, 22b-2, 22b-3, and 22b-4 are laminated more than two times alternately. The refractive index of the second insulation layers 22b-1 to 22b-4 is lower than the refractive index of the first insulation layers 21b-1 to 21b-5. The first insulation layers 21b-1 to 21b-5 are made of, for example, titanium oxide ($TiO_2$, a refractive index of 2.5). The second insulation layers 22b-1 to 22b-4 are made of silicon oxide ($SiO2$, a refractive index of 1.45).

The second insulation layers 22b-1 to 22b-4 have the thicknesses similar to each other. The first insulation layers 21b-1, 21b-2, 21b-4, and 21b-5 have the film thicknesses similar to each, other. On the other hand, the film thickness of the first insulation layer 21b-3 is larger than the film thickness of each of other first insulation layers 21b-1, 21b-2, 21b-4, and 21b-5. This first insulation layer 21b-3 will be also referred to as a spacer layer 21b-3 in particular below.

Here, in the color filter 20r and the color filter 20b, the corresponding insulation layers except for the spacer layers 21r-3 and 21b-3 are made to be equal in thickness to each other and thus a transmission band is changed according to a difference in the thicknesses between the spacer layers 21r-3 and 21b-3. For example, a case may be considered in which the first insulation layers 21r-1 to 21r-5 and the first insulation layers 21b-1 to 21b-5 are made of $TiO_2$ (a refractive index of 2.5) and the second insulation layers 22r-1 to 22r-4 and the second 22b-1 to 22b-4 are made of $SiO_2$ (a refractive index of 1.45). In this case, if the total film thickness of the color filter 20r and the total film thickness of the color filter 20b are set to 622 nm and 562 nm, respectively, and the film thicknesses of the spacer layers 21r-3 and 21b-3 are set to 80 nm and 20 nm, respectively; the color filter 20r exhibits a peak spectral transmittance with respect to a red color wavelength band, and the color filter 20b exhibits a peak spectrum transmittance with respect to a blue color wavelength band.

The insulation film 43 covers the color filter 20b. This allows equalization of the heights of the upper surface of the color filter 20r and the upper surface of the insulation film 43, both from the surface 10a of the semiconductor substrate 10. That is, this may allow provision of a flat surface in which the upper surface of the color filter 20r and the upper surface of the insulation film 43 are included.

The pixel electrode film 61g covers the color filter 20r and the insulation film 43. The pixel electrode film 61g serves as a pixel electrode for collecting an electric charge generated in the photo-electric conversion layer 70g. The pixel electrode film 61g is connected to the conductive pattern 31g via the contact plug 82g. The pixel electrode film 61g is made of a transparent conductive material such as indium tin oxide (ITO) and zinc oxide (ZnO). In addition, the pixel electrode film 61g may be made of a translucent conductive material that permits transmission of the light of wavelengths in at least blue and red ranges but reflects the light of wavelengths in a green color range.

The photo-electric conversion layer 70g covers the pixel electrode film 61g. The photo-electric conversion layer 70g absorbs the light of wavelengths in a green color range, out of the light received, and generates an electric charge according to the light absorbed. The photo-electric conversion layer 70g is, for example, an organic photo-electric conversion layer and is made of an organic material having a property of absorbing the light of wavelengths in a green color range and of permitting transmittance of the light of wavelengths in any range other than the former range.

The common electrode film 62g covers the photo-electric conversion layer 70g. The common electrode film 62g functions to apply a bias voltage, which is externally supplied, to the photo-electric conversion layer 70g. This makes it easier for the electric charge generated in the photo-electric conversion layer 70g to be collected in the pixel electrode film 61g. The common electrode film 62g is made of, for example, a transparent conductive material such as ITO and ZnO. Alternatively, the common electrode film 62g may be made of, for example, a translucent conductive material that permits transmission of the light of wavelengths in at least green, blue, and red colors and reflects the light in a predetermined wavelength range.

The contact plug 81r passes through the insulation film 41 to electrically connect the conductive pattern 31r to the storage diode 11r in the semiconductor substrate 10. The contact plug 82r passes through the insulation film 42 to electrically connect the conductive pattern 32r to the conductive pattern 31r. This allows the contact plugs 81r and 82r to transmit the electric charges collected in the conductive patterns 32r to the storage diodes 11r.

The contact plug 81g passes through insulation film 41 to electrically connect the conductive pattern 31g to the storage diode 11g in the semiconductor substrate 10. The contact plug 82g extends passing through the insulation film 42 toward the semiconductor substrate 10 and passes between the color filter 20r and the color filter 20b, so that the pixel electrode film 61g and the conductive pattern 31g are electrically connected to each other. Accordingly, the contact plugs 81g and 82g can transmit the electric charges collected in the pixel electrode films 60b to the storage diodes 11g.

The contact plug 81b passes through the insulation film 41 to electrically connect the conductive pattern 31b to the storage diode 11b in the semiconductor substrate 10. The contact plug 82b passes through the insulation film 42 to electrically connect the conductive pattern 32b and the conductive pattern 31b to each other. Accordingly, the contact plugs 81b and 82b can transmit the electric charge collected in the conductive pattern 32b to the storage diode 11b.

Here, all the films disposed between the pixel electrode film 61g and the semiconductor substrate 10 may be made of an inorganic material. The contact plugs 81r, 82r, 81g, 82g, 81b, and 82b pass through inorganic films without passing through organic films.

Hereinbelow, a method of manufacturing the solid state imaging device 1 according to a first exemplary embodiment will be described with reference to FIGS. 3A to 3E. FIGS. 3A to 3E are sectional views illustrating respective processes of the method of manufacturing the solid state imaging device 1 according to the first exemplary embodiment.

Figure 3A:
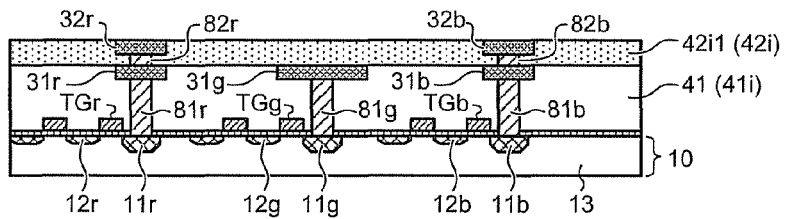
FIG. 3A to FIG. 3E are diagrams illustrating a method of manufacturing a solid state imaging device according to an exemplary embodiment of the invention.

In the process step shown in FIG. 3A, a well region 13 of a semiconductor substrate 10 is subjected to an ion implantation process so that storage diodes 11r, 11g, and 11b, floating diffusions 12r, 12g, and 12b, and other semiconductor regions are formed in the well region 13. The well region 13 is a semiconductor body (for example, silicon) containing impurities of a first conductivity type (for example, P type) therein at a low concentration. The storage diodes 11r, 11g, and 11b and the floating diffusions 12r, 12g, and 12b are formed through a process in which impurities of a second conductivity type (for example, N type), which is a conductivity type opposite to the first conductivity type, are implanted into the well region 13 of the semiconductor substrate 10 at a concentration higher than that of the impurities of the first conductivity type.

Subsequently, the gate electrodes TGr, TGg, and TGb, other gate electrodes, and the like are formed on the semiconductor substrate 10 with use of polysilicon. Then, the insulation film 41i made of, for example, $SiO_2$ is deposited, for example, by a CVD method or the like so as to cover the semiconductor substrate 10, the gate electrodes TGr, TGg, and TGb, other gate electrodes, and the like.

Next, a lithography process and a dry etching process are performed to form a plurality of contact holes passing through the insulation film 41 and allowing the surfaces of the storage diodes 11r, 11g, and 11b in the semiconductor substrate 10 to be exposed to the outside therethrough. The dry etching process is performed by reactive ion etching (RIE) equipment under conditions of allowing highly anisotropic etching, in order to produce contact holes having a high aspect ratio (depth to width). Simultaneously, grooves, in which the conductive patterns 31r, 31g, and 31b are scheduled to be disposed, are formed near the surface of the insulation film 41.

Next, a conductive material is deposited by a CVD process so as to fill the respective contact holes and the respective grooves. The conductive material may be, for example, tungsten or copper. Subsequently, a CMP process is performed to remove the conductive material on the upper surface of the insulation film 41, leaving the conductive material in the respective contact holes and the respective grooves. Through these processes, the contact plugs 81r, 81g, and 81b and the conductive patterns 31r, 31g, and 31b are formed.

Next, an insulation film 42i is formed by a CVD process so as to cover the insulation film 41 and the conductive patterns 31r, 31g, and 31b. The insulation film 42i is formed through deposition with use of, for example, $SiO_2$.

Next, a lithography process and a dry etching process are performed to form a plurality of contact holes passing through the insulation film 42i1 and allowing the surfaces of the conductive patterns 31r and 31b to be exposed to the outside therethrough. The dry etching process is performed by reactive ion etching (RIE) equipment under conditions of allowing highly anisotropic etching, in order to produce contact holes having a high aspect ratio (depth to width). Simultaneously, grooves, in which the conductive patterns 32r and 32b are scheduled to be disposed, are formed near the surface of the insulation film 42i1.

Next, a conductive material is deposited by a CVD process so as to fill the respective contact holes and the respective grooves. The conductive material may be, for example, tungsten or copper. Subsequently, a CMP process is performed to remove the conductive material on the upper surface of the insulation film 42i1, leaving the conductive material in the respective contact holes and the respective grooves. Through these processes, the contact plugs 82r and 82b and the conductive patterns 32r and 32b are formed.

Alternatively, instead of forming grooves in the insulation film 42i1, the conductive patterns 32r and 32b may be formed in such a way of forming contact holes in an insulation film and filling the contact holes with a conductive material to produce contact plugs, of forming a metal film on the insulation film and contact plugs, and of patterning the metal film.

Figure 3B:
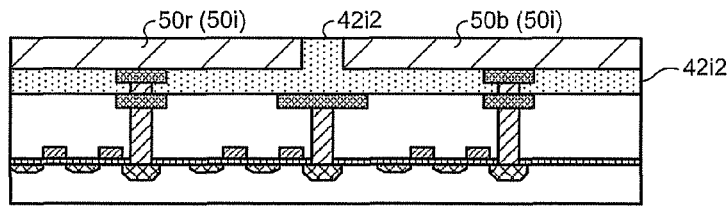

In the process step shown in FIG. 3B, a photo-electric conversion layer 50i is formed by a deposition process such as sputtering process on the insulation film 42i1 and the conductive patterns 32r and 32b. The photo-electric conversion layer 50i is made of an inorganic material having a property of absorbing the light of wavelengths in a wavelength range including, for example, a red color range and a blue color range. For example, the photo-electric conversion layer 50i is made of an inorganic material having a property of absorbing the light of wavelengths in the whole wavelength range of visible light. The photo-electric conversion layer 50i is mainly made of, for example, a material containing a component, as a main component, selected from the group consisting silicon, cadmium sulfide, cadmium selenide, lead sulfide, and lead selenide. The photo-electric conversion layer 50i may be a monocrystalline, polycrystalline, or amorphous layer containing the main component.

Subsequently, a lithography process and a dry etching process are performed to pattern the photo-electric conversion layer 50i. That is, a dry etching process is performed on the photo-electric conversion layer 50i with a photoresist pattern as an etching mask. This process divides the photo-electric conversion layer 50i into the photo-electric conversion layer 50r and the photo-electric conversion layer 50b.

Next, an insulation material is deposited by a CVD process so as to fill, with an insulation material, a gap between the photo-electric conversion layer 50r and the photo-electric conversion layer 50b. For this case, the insulation material is formed so as to cover the upper surfaces of the photo-electric conversion layer 50r and the photo-electric conversion layer 50b. The insulation material may be formed with use of $SiO_2$.

A CMP process is performed to remove the insulation material on the upper surfaces of the photo-electric conversion layer 50r and the photo-electric conversion layer 50b, leaving the insulation film 42i2 in a gap between the photo-electric conversion layer 50r and the photo-electric conversion layer 50b.

Figure 3C:
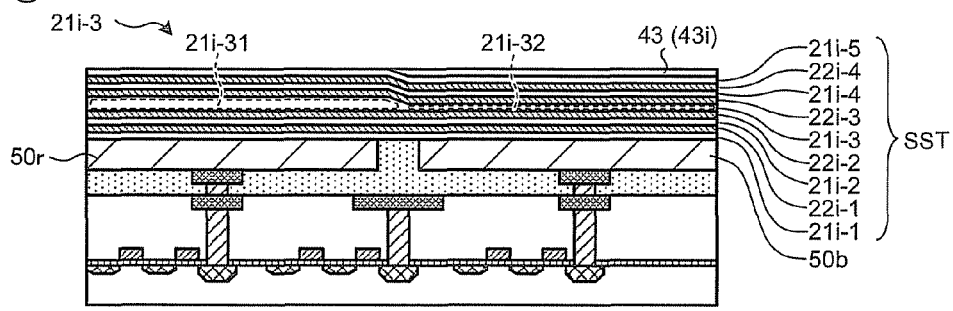

In the process step shown in FIG. 3C, laminate structures to serve as the color filters 20r and 20b, respectively, are formed using photonic crystals of an inorganic material. Specifically, by a sputtering process or the like, a first insulation layer 21i-1, a second insulation layer 22i-1, a first insulation layer 21i-2, and a second insulation layer 22i-2 are sequentially deposited. The first insulation layers 21i-1 and 21i-2 are made of, for example, titanium oxide ($TiO_2$). The first insulation layers 21i-1 and 21i-2 are formed to have the same film thickness. The second insulation layers 22i-1 and 22i-2 are made of silicon oxide ($SiO_2$). The second insulation layers 22i-1 and 22i-2 are formed to have the same film thickness.

Next, a sputtering process or the like is performed to form a first insulation layer 21i-3 on the second insulation layer 22i-1. The insulation layer is formed to have a film thickness of, for example, 80 nm corresponding to a wavelength band of a red color. Next, by a lithography process, a resist pattern is formed to cover a portion 21*i*-31 of the insulation layer, which corresponds to an upper portion of the photo-electric conversion layer 50*r*. Subsequently, a dry etching process is performed using the resist pattern as an etching mask, so that the film is thinned. That is, etching is performed with respect to a portion 21*i*-32 of the insulation layer, which corresponds to an upper portion of the photo-electric conversion layer 50*b*, until the corresponding portion comes to have a film thickness (for example, 20 nm) corresponding to a wavelength band of a blue color. As a result, formed is the first insulation layer 21*i*-3 having a step corresponding to a gap between the photo-electric conversion layer 50*r* and the photo-electric conversion layer 50*b*.

Subsequently, by a sputtering process or the like, a second insulation layer 22*i*-3, a first insulation layer 21*i*-4, a second insulation layer 22*i*-4, and a first insulation layer 21*i*-5 are sequentially deposited. Each of the second insulation layer 22*i*-3, the first insulation layer 21*i*-4, the second insulation layer 22*i*-4, and the first insulation layer 21*i*-5 has a step corresponding to the step of the first insulation layer 21*i*-3 at a portion corresponding to a gap between the photo-electric conversion layer 50*r* and the photo-electric conversion layer 50*b*. As a result, the laminate structure SST is obtained in which the first insulation layers 21*i*-1 to 21*i*-5 are laminated.

Next, SiO$_2$ is deposited by a CVD process to form an insulation film 43*i* covering the laminate structure SST. The insulation film 43*i* is planarized by a CMP process, until a portion of the laminate structure SST, which corresponds to the photo-electric conversion layer 50*r*, is exposed. This results in the insulation film 43 covering a portion of the laminate structure SST, which corresponds to the photo-electric conversion layer 50*b*. These processes of forming and planarizing the insulation film 43*i* may not be performed.

Figure 3D:
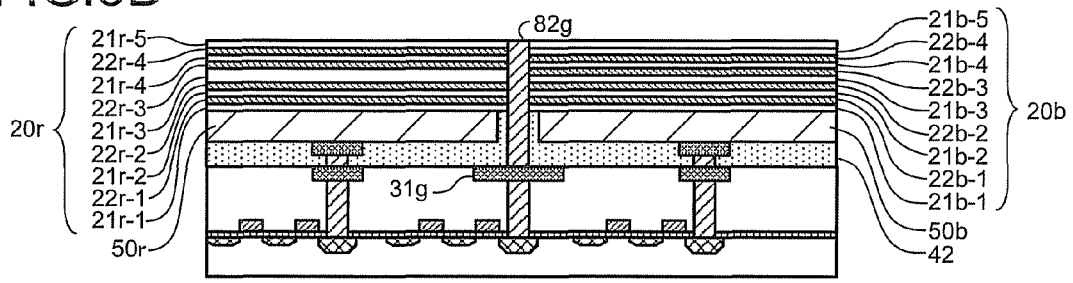

In the process shown in FIG. 3D, a lithography process and a dry etching process are performed to form contact holes, which pass through the laminate structure SST and the insulation film 41*i*2, and which allow the surface of conductive pattern 31*g* to be exposed to the outside therethrough. The dry etching process is performed with use of, for example, RIE equipment under conditions of allowing highly anisotropic etching, in order to form contact holes having a high aspect ratio (depth to width). As a result, on the photo-electric conversion layer 50*r*, the color filter 20*r* is formed which includes first insulation layers 21*r*-1, 21*r*-2, 21*r*-3, 21*r*-4, and 21*r*-5 and second insulation layers 22*r*-1, 22*r*-2, 22*r*-3, and 22*r*-4 laminated more than two times alternately. In addition, on the photo-electric conversion layer 50*b*, the color filter 20*b* is formed which includes first insulation layers 21*b*-1, 21*b*-2, 21*b*-3, 21*b*-4, and 21*b*-5 and second insulation layers 22*b*-1, 22*b*-2, 22*b*-3, and 22*b*-4 laminated more than two times alternately.

Next, a conductive material is deposited, by a CVD process, on the entire surface so as to fill the contact holes. The conductive material is, for example, tungsten. Subsequently, a CMP process is performed to remove the conductive material covering the color filter 20*r* and the color filter 20*b*, leaving the conductive material in the contact holes, so that the contact plugs 82*g* are formed.

Figure 3E:
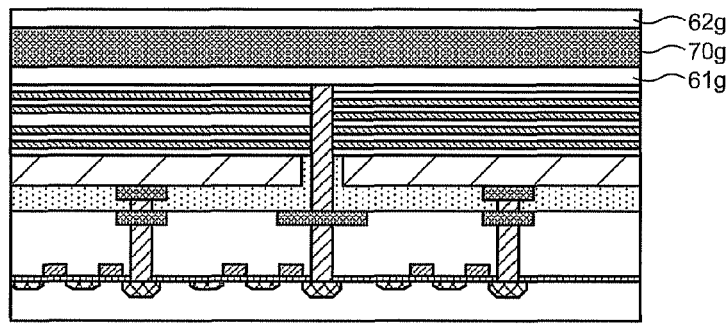

In the process step shown in FIG. 3E, a sputtering process or the like is performed to deposit the pixel electrode film 61*g* so as to cover the contact plugs 82*g* and the insulation film 43. The pixel electrode film 61*g* is made of a transparent conductive material such as ITO and ZnO. The pixel electrode film 61*g* may be made of a translucent conductive material that permits transmission of the light of wavelengths in the range of at least blue and red colors but reflects the light of wavelengths in at least a green color range.

Next, a photo-electric conversion layer 70*g* is deposited by a sputtering process or the like so as to cover the pixel electrode film 61*g*. The photo-electric conversion layer 70*g* is made of an organic material having a property of absorbing the light of wavelengths in, for example, a green color range, and of permitting the transmission of the light of wavelengths in the wavelength ranges of the other colors.

Next, a common electrode film 62*g* is deposited by a sputtering process or the like so as to cover the photo-electric conversion layer 70*g*. The common electrode film 62*g* is made of a conductive material such as ITO and ZnO. The common electrode film 62*g* may be made of a translucent conductive material having a property of permitting the transmission of the light of wavelengths in the wavelength ranges of, for example, at least a green color, a blue color, and a red color, and of reflecting the light of wavelengths in a predetermined wavelength range.

Here, considered is a case where, in a certain solid state imaging device, three organic photo-electric conversion layers are laminated on a semiconductor substrate. In this case, when forming contact plugs that electrically connect storage diodes to pixel electrode films for collecting an electrical charge in the uppermost (third) organic photo-electric conversion layer, it is necessary to form contact holes that pass through a second organic photo-electric conversion layer and the lowermost (first) floor photo-electric conversion layer and that allow the surface of the storage diode to be exposed therethrough. For this case, since both the first organic photo-electric conversion layer and the second organic photo-electric conversion layer are organic layers, it is problematic to apply microfabrication processing thereto and thus it is difficult to reduce the dimension of the through hole.

In contrast, in the embodiment, the uppermost photo-electric conversion layer 70*g* is made of an organic material, but the underlying layers are made of an inorganic material. That is, the underlying layers including the color filter 20*r* and the color filter 20*b* are made of an inorganic material and the underlying layers including the photo-electric conversion layer 50*r* and the photo-electric conversion layer 50*b* are made of an inorganic material. That is, all the respective films formed between the pixel electrode film 61*g* and the semiconductor substrate 10 are made of an inorganic material. Accordingly, when forming the contact plugs 81*g* and 82*g* that electrically connect the storage diodes 11*g* to the pixel electrode film 61*g* for collecting an electric charge generated in the uppermost photo-electric conversion layer 70*g*, it may be possible to form contact holes passing through inorganic films without passing through organic films. In this case, since the photo-electric conversion layer 50*r* and the photo-electric conversion layer 50*b* are made of an inorganic material, in the process step shown in FIG. 3B, use of microfabrication processing is not problematic and thus it may be possible to allow a small width of the insulation film 42*i*2, which is present between the photo-electric conversion layer 50*r* and the photo-electric conversion layer 50*b* and through which contact holes are scheduled to be formed. Furthermore, since the color filter 20*r* and the color filter 20*b* are made of an inorganic material, in the process step shown in FIG. 3D, use of microfabrication processing is not problematic, so that it may be possible to reduce the dimension of the contact holes that may be formed to pass through the laminate structures SST to serve as the color filter 20*r* and the color filter 20*b*. Accordingly, according to the embodiment, it may be possible to provide the solid state imaging device 1 having a structure that is advantageous to the microfabrication processing and that includes a plurality of photo-electric conversion layers 50r, 50b, and 70g laminated therein.

Alternatively, in a case where three organic photo-electric conversion layers are laminated on a semiconductor substrate, since a plurality (or a couple of) of organic photo-electric conversion layers are disposed between the light incidence surface and the lowermost photo-electric conversion layer of a solid state imaging device, the distance from the light incidence surface to the lowermost photo-electric conversion layer of the solid state imaging device is far.

In contrast, the solid state imaging device according to the embodiment includes one organic photo-electric conversion layer 70g disposed between the light incidence surface and the lowermost photo-electric conversion layer 50r (or 50b). Moreover, since the color filter 20r (or 20b) disposed between the organic photo-electric conversion layer 70g and the lowermost photo-electric conversion layer 50r (or 50b) is made of an inorganic material, it is easy to form thin films (for example, 1 µm). For such a reason, it is easy to shorten the distance between the light incidence surface and the lowermost photo-electric conversion layer 50r (or 50b) in the solid state imaging device.

Moreover, in a case where the thickness of the color filter 20r (or 20b) is small, it may be possible to easily suppress the mixing of colors attributable to the obliquely incident light which enters the front surface 10a of the semiconductor substrate 10 at an acute angle to the normal line of the front surface 10a.

Figure 2A:
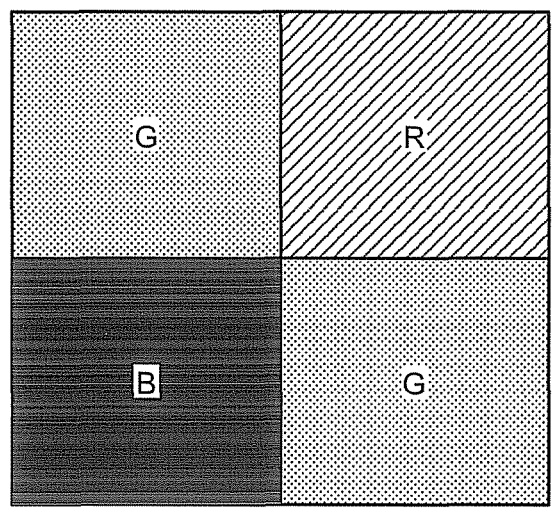
FIG. 2A and FIG. 2B are diagrams illustrating one function of a filter according to a comparative example and one function of a filter according an exemplary embodiment of the invention, respectively.

Alternatively, considered is a case where a solid state imaging device does not include a plurality of photo-electric conversion layers laminated therein. In such a case, for example, a photo-electric conversion layer (a photodiode) is formed in a semiconductor substrate, and a color filter is disposed between the photodiode and a micro-lens for collecting light into the photodiode. In this solid state imaging device, as shown in FIG. 2A, a plurality of color filters G, R, B, and G are two-dimensionally arranged according to the Bayer arrangement, and a plurality of pixels (photodiodes) corresponding to the plurality of color filters are two-dimensionally arranged. As such, since one color corresponds to one pixel, in a case where a predetermined number of colored pixels are arranged within a predetermined area, the area of one pixel prone to be small and accordingly the light receiving area of the photo-electric conversion layer (photodiode) also prone to be small.

In contrast, in the embodiment, the color filter 20r is disposed between the photo-electric conversion layer 70g serving as a color filter G and the photo-electric conversion layer 50r, and the color filter 20b is disposed between the photo-electric conversion layer 70g serving as the color filter G and the photo-electric conversion layer 50b. In this solid state imaging device 1, as shown in 2B, the color filters R and the color filters B are arranged in lateral direction, and the color filters G are superimposed on the color filters R and color filters B. That is, a plurality of color filters G, R, and B are three-dimensionally arranged. With such a structure, three colors correspond to one pixel. Accordingly, in a case where a predetermined number of colored pixels are arranged within a predetermined area, the area of one pixel is large and accordingly the light receiving surface area of each of the photo-electric conversion layers 50r, 50b, and 70g can be large.

Figure 2B:
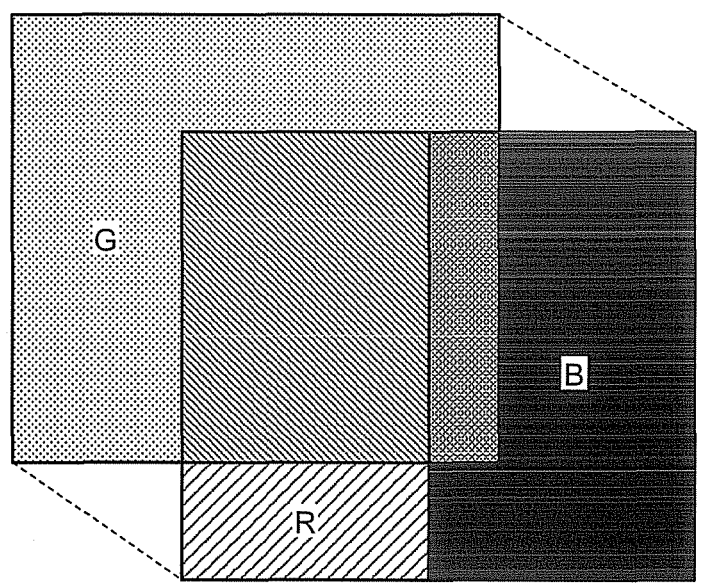

Moreover, as shown in FIG. 2B, the color filter G is configured to have a light receiving area larger (for example, two times) than that of each of the other color filters R and B. Accordingly, it may be possible to enhance the sensitivity with respect to a green color which is generally known to be week in sensitivity. With such a configuration, it may be possible to reduce the unevenness in sensitivity among respective colors (G, R, and B).

Furthermore, in the embodiment, as described above, since it may be possible to easily shorten the distance from the light incidence surface to the lowermost photo-electric conversion layer 50r (or 50b) in the solid state imaging device 1, it may be possible to introduce a sufficient amount (necessary amount) of light to the lowermost photo-electric conversion layers 50 and 50b without using micro-lenses.

Alternatively, there may be considered a case where, instead of incorporating the color filter 20r and the color filter 20b, the photo-electric conversion layer 50r is formed with use of an inorganic material having a property of absorbing the light of wavelengths in a red color range and of permitting the transmission of the light of wavelengths in the range of other colors, and the photo-electric conversion layer 50b is formed with use of an inorganic material having a property of absorbing the light of wavelengths in a blue color range and of permitting transmission of the light of wavelengths in the range of other colors. In this case, since the material that can be used for each of the photo-electric conversion layer 50r and for the photo-electric conversion layer 50b is limited, the photo-electric conversion layer 50r and the photo-electric conversion layer 50b prone to be low in design flaxibility.

In contrast, in the embodiment, the color filter 20r selectively guides the light of wavelengths in a red color range, out of the light that has passed through the photo-electric conversion layer 70g (i.e., the light lacking a light component of wavelengths in a green color range due to light absorption), up to the photo-electric conversion layer 50r. The photo-electric conversion layer 50r may be made of an inorganic material having a property of absorbing the light of wavelengths in any wavelength range including a red color range and a blue color range. The color filter 20b selectively guides the light of wavelengths in a blue color range, out of the light that has passed through the photo-electric conversion layer 70g, to the photo-electric conversion layer 50b. Therefore, the photo-electric conversion layer 50b may be made of an inorganic material having a property of absorbing the light of wavelengths in any wavelength range as long as it includes a red color range and a blue color range. For such a reason, the material, which can be used for each of the photo-electric conversion layer 50r and the photo-electric conversion layer 50b, can be selected from a broad range, and therefore the photo-electric conversion layer 50r and the photo-electric conversion layer 50b can be high in design flexibility.

For example, each of the photo-electric conversion layer 50r and the photo-electric conversion layer 50b may be made of an inorganic material having a property of absorbing the light of wavelengths in the whole wavelength range of visible light. In this case, the photo-electric conversion layer 50r and the photo-electric conversion layer 50b function as a light shielding film that shields the surface of the semiconductor substrate 10 from light.

In a case where the color filter 20r and the color filter 20b are not incorporated, since it is not allowed that the photo-electric conversion layer 50r and the photo-electric conversion layer 50b are made of the same material, in the process step shown in FIG. 3B, it is necessary to perform processes of deposition and patterning of the photo-electric conversion layer twice, and thus the process becomes complicated.

In contrast, in the embodiment, since the color filter 20r and the color filter 20b have a function of a filter, they may be made of the same material as that of the photo-electric conversion layer 50r and the photo-electric conversion layer 50b. Accordingly, in the process step shown in FIG. 3B, by performing process of deposition and patterning of the photo-electric conversion layer 50i just once, it may be possible to form the photo-electric conversion layer 50r and the photo-electric conversion layer 50b. That is, it may be possible to form the photo-electric conversion layer 50r and the photo-electric conversion layer 50b in a lump, by the simplified process.

Moreover, the uppermost photo-electric conversion layer may be made of an organic material having a property of absorbing the light of wavelengths in a blue color range and of permitting the transmission of the light of wavelengths in the range of other colors. In such a case, under the uppermost photo-electric conversion layer are disposed the color filter (made of an inorganic material) that permits the transmission of a red color and the color filter (made of an inorganic material) that permits the transmission of a green color. For example, there may be considered a case where the first insulation layers 21r-1 to 21r-5 and 21b-1 to 21b-5 are made of $TiO_2$ (a refractive index of 2.5), and the second insulation layers 22r-1 to 22r-4 and 22b-1 to 22b-4 are made of $SiO_2$ (a refractive index of 1.45). In such a case, if the total film thickness of the color filter 20r and the total film thickness of the color filter 20b are set to 622 nm and 542 nm, respectively, and the film thickness of the spacer layer 21r-3 and the film thickness of the spacer layer 21b-3 are set to 80 nm and 0 nm, respectively; the color filter 20r has a peak spectral transmittance for a red color wavelength band and the color filter 20b has a peak spectral transmittance for a green wavelength band. For this case, the pixel electrode pattern may be made of a translucent material that permits the transmission of all the light components of wavelengths which are targets for photoelectric conversion in the underlying photoelectric conversion film, and that reflects the light component of wavelengths, which are targets for photoelectric conversion in the overlying photoelectric conversion film.

Alternatively, the uppermost photo-electric conversion layer may be made of an organic material having a property of absorbing the light of wavelength in a red color range and of permitting the transmission of the light of wavelengths in the range of other colors. In this case, under the uppermost photo-electric conversion layer are disposed the color filter (inorganic material) permitting transmission of a blue color and the color filter (inorganic material) permitting transmission of a green color. For example, there may be further considered that the first insulation layers 21r-1 to 21r-5, and 21b-1 to 21b-5 are made of $TiO_2$ (a refractive index of 2.5), and the second insulation layers 22r-1 to 22r-4 and 22b-1 to 22b-4 are made of $SiO_2$ (a refractive index of 1.45). In this case, if the total film thickness of the color filter 20r and the total film thickness of the color filter 20b are set to 542 nm and 562 nm, respectively, and the film thickness of the spacer layer 21r-3 and the film thickness of the spacer layer 21b-3 are set to 0 nm and 20 nm, respectively; the color filter 20r has a peak spectral transmittance for a green wavelength band and the color filter 20b has a peak spectral transmittance for a blue color wavelength band. In this case, the pixel electrode pattern may be made of a translucent material permitting the transmission of the light component of wavelengths which are targets for photoelectric conversion in the underlying photoelectric conversion film and reflecting the light component of wavelengths that are targets for photoelectric conversion in the overlying the photoelectric conversion film.

The color filter 20r and the color filter 20b may be configured to have transmission bands that differ from each other by introducing a difference in film thickness between the corresponding insulation layers thereof, instead of incorporating the spacer layers (layers thicker than the other insulation layers). For example, there may be considered a case where the first insulation layers 21r-1 to 21r-5 and 21b-1 to 21b-5 are made of $SiO_2$ (a refractive index of 1.45) and the second insulation layers 22r-1 to 22r-4 and 22b-1 to 22b-4 are made of silicon nitride ($Si_3N_4$, a refractive index of 2.0). In such a case, as for the color filter 20r, if the film thicknesses of the respective first insulation layers 21r-1 to 21r-5 are set to be in the range of from 60 nm to 80 nm, and the film thicknesses of the respective second insulation layers 22r-1 to 22r-4 are set to be in the range of from 10 nm to 20 nm; the color filter 20r has a peak spectral transmittance for a red wavelength band. As for the color filter 20b, if the thicknesses of the respective first insulation layers 21b-1 to 21b-5 are set to be in the range of from 30 nm to 60 nm, and the thicknesses of the respective second insulation layers 22b-1 to 22b-4 are set to be in the range of from 40 nm to 80 nm, the color filter 20b has a peak spectral transmittance for a blue color wavelength band. In addition, if the thicknesses of the respective first insulation layers are set to be in the range of from 70 nm to 110 nm and the thicknesses of the respective second insulation layers are set to be in the range of from 50 nm to 80 nm, the color filter in which the first insulation layers and the second insulation layers are alternately laminated more than one times, has a peak spectral transmittance for a green color wavelength band.

Alternatively, the color filter 20r and the color filter 20b may be color filters using quantum dots. That is, each of the color filter 20r and the color filter 20b is configured in such a way that quantum dots (for example, silicon dots), each having the same diameter, are present in an insulation layer (for example $SiO_2$) with a low refractive index. Accordingly, a difference in the transmission band between the color filter 20r and the color filter 20b is introduced by a difference in the diameter of the quantum dots. For example, if the diameter of the quantum dots in the color filter 20r is 3 nm and the IR filter is disposed on the light incidence side of the color filter 20r, the color filter 20r has a peak spectral transmittance for a red wavelength band. For example, if the diameter of the quantum dots in the color filter 20b is 1.2 nm and the IR filter is disposed on the light incidence side of the color filter 20b, the color filter 20b has a peak spectral transmittance for a blue color wavelength band.

Figure 4:
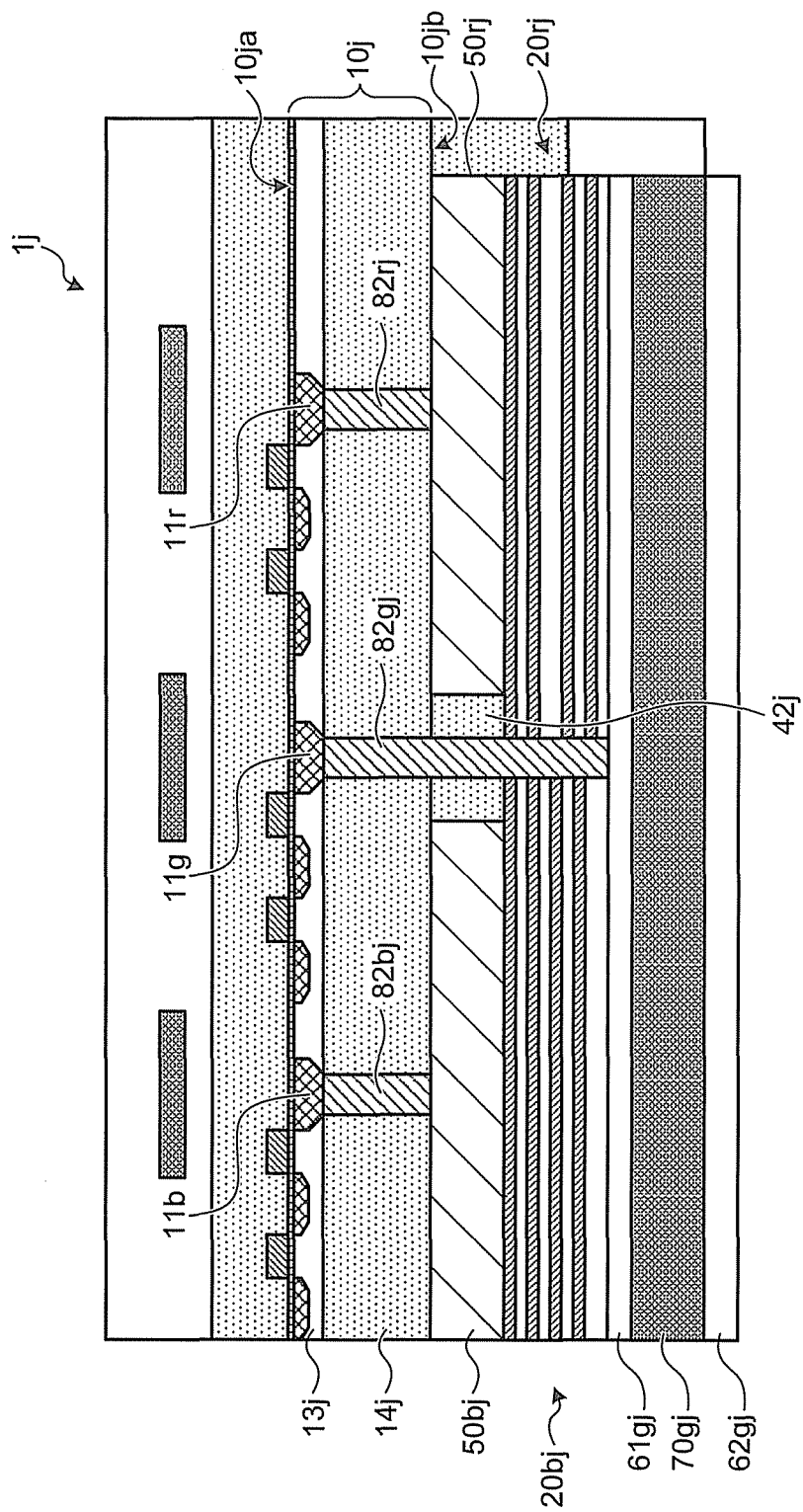
FIG. 4 is a diagram illustrating the configuration of a solid state imaging device according to an exemplary modification of the embodiment of the invention.

Moreover, as shown in FIG. 4, a solid state imaging device 1j may be a backside-illuminated image sensor. Specifically, a semiconductor substrate 10j has a front surface 10ja including an active region 13j disposed therein and a back surface 10jb including a buried oxide layer 14j exposed to the outside. A photo-electric conversion layer (first photo-electric conversion layer) 70gj of an organic material is disposed on a side of the back surface 10jb of the semiconductor substrate 10j. An inorganic material of a photo-electric conversion layer (second photo-electric conversion layer) 50rj is disposed between the photo-electric conversion layer 70gj and the semiconductor substrate 10j. An inorganic material of a photo-electric conversion layer (third photo-electric conversion layer) 50bj is disposed between the photo-electric conversion layer 70gj and the semiconductor substrate 10j, and is disposed adjacent to a photo-electric conversion layer 50rj, in terms of a direction along the photo-electric conversion layer 70gj. An inorganic material of a color filter (first filter) 20rj is disposed on the side of the back surface 10jb of the semiconductor substrate 10j, in particular at between the photo-electric conversion layer 70gj and the photo-electric conversion layer 50rj. An inorganic material of a color filter (second filter) 20bj is disposed on the side of the back surface 10jb of the semiconductor substrate 10*j*, in particular between the photo-electric conversion layer 70*gj* and the photo-electric conversion layer 50*bj*.

The semiconductor substrate 10*j* can be obtained by preparing, for example, an SOI substrate and grinding the back surface of the SOI substrate to allow the buried oxide layer 14*j* to be exposed to the outside. Contact holes are formed in the buried oxide layer 14*j* so as to allow the back surfaces of the storage diodes 11*b*, 11*g*, and 11*r* to be exposed therethrough, and then the contact holes are filled with a conductive material, producing respective contact plug 82*bj*, 82*gj*, and 82*rj*. Then, by using an attaching technique, the respective photo-electric conversion layers and the respective color filters are attached to the back surface 10*jb* of the semiconductor substrate 10*j*. In this way, the solid state imaging device 1*j* can be manufactured.

In the solid state imaging device 1*j*, while the photo-electric conversion layer 70*gj* is made of an organic material, the color filter 20*rj* and the color filter 20*bj* on the semiconductor substrate 10*j* are made of an inorganic material and the photo-electric conversion layer 50*rj* and the photo-electric conversion layer 50*bj* are made of an inorganic material. That is, the respective films disposed between the pixel electrode film 61*gj* and the semiconductor substrate 10*j* are made of an inorganic material. As such, when forming the contact plugs 82*gj* that connect the storage diodes 11*g* to the pixel electrode films 61*gj* for collecting an electric charge in the photo-electric conversion layer 70*gj*, it may be possible to form the contact holes passing through inorganic films without passing through organic films. In this case, since the photo-electric conversion layer 50*rj* and the photo-electric conversion layer 50*bj* are made of an inorganic material, microfabrication processing can be used, and this allows a small width of the insulation film 42*j*, which is disposed between photo-electric conversion layer 50*rj* and the photo-electric conversion layer 50*bj* and through which the contact holes are scheduled to be formed. Since the color filter 20*rj* and the color filter 20*bj* are made of an inorganic material, microfabrication processing can be used, so that it may be possible to reduce the dimension of the contact holes passing through the laminate structures (the structures similar to the laminate structure SST shown in FIG. 3C) to serve as the color filter 20*rj* and the color filter 20*bj*. Therefore, according to this exemplary modification, it may be possible to provide the solid state imaging device 1*j* having a structure that is advantageous to macrofabrication processings and that includes a plurality of laminated photo-electric conversion layers 50*rj*, 50*bj*, and 70*gj*.

Figure 5:
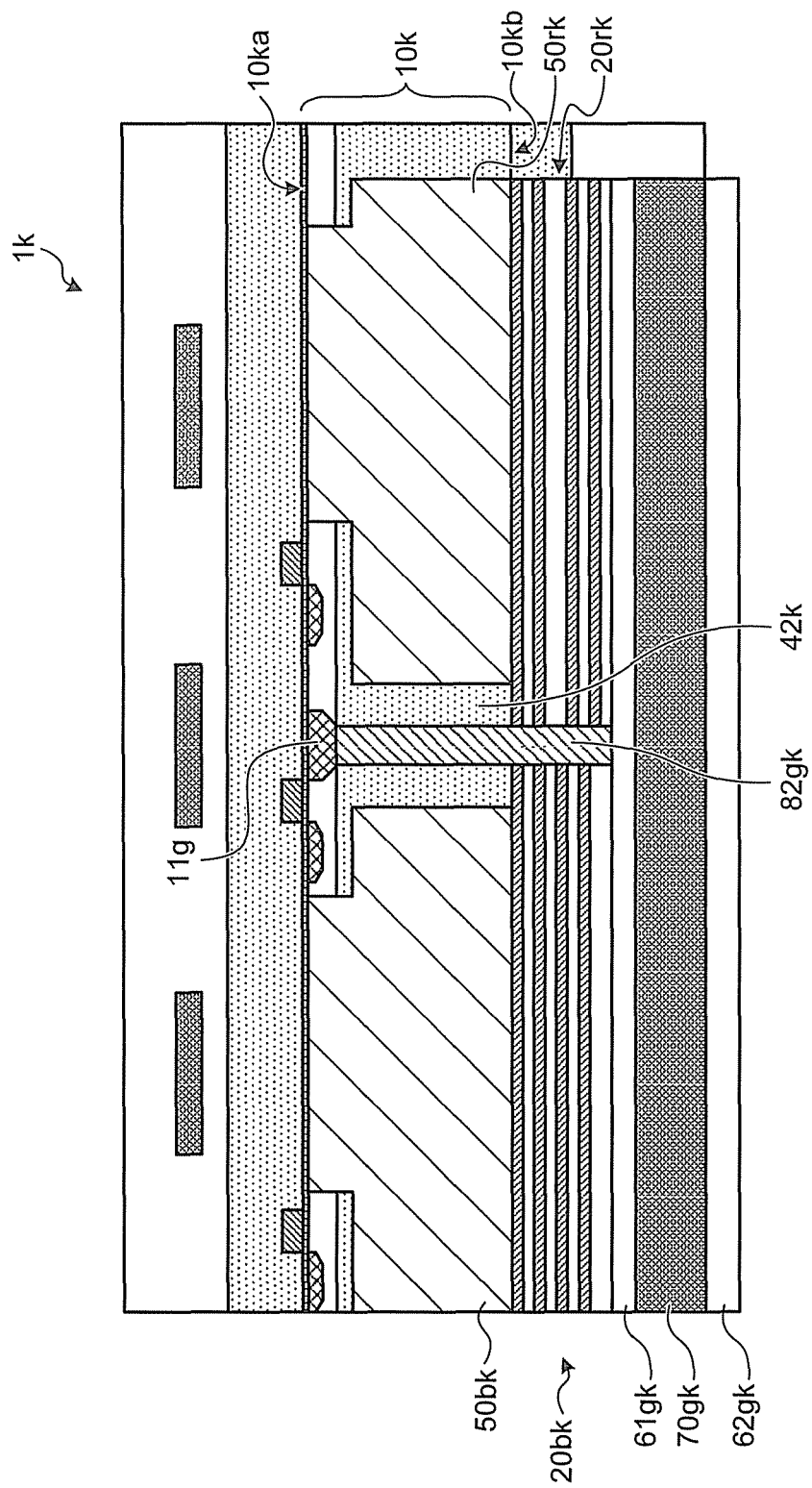
FIG. 5 is a diagram illustrating the configuration of a solid state imaging device according to another exemplary modification of the embodiment of the invention.

Alternatively, as shown in FIG. 5, a solid state imaging device 1*k* is a backside-illuminated image sensor according to another modification. Specifically, the semiconductor substrate 10*k* may be an inorganic material (for example, silicon). The semiconductor substrate 10*k* has a front surface 10*ka* and a back surface 10*kb*. A photo-electric conversion layer (first photo-electric conversion layer) 70*gk* of an organic material is disposed on the back surface 10*kb* side of the semiconductor substrate 10*k*. An inorganic material of a photo-electric conversion layer (second photo-electric conversion layer) 50*rk* is disposed within at least the back surface 10*kb* (for example, being continuous from the front surface 10*ka* to back surface 10*b*) of the semiconductor substrate 10*k*. The photo-electric conversion layer 50*rk* may be, for example, a photodiode, and include a P type layer and an N type layer. An inorganic material of a photo-electric conversion layer (third photo-electric conversion layer) 50*bk* is disposed within at least the back surface 10*kb* (for example, being continuous from the front surface 10*ka* to back surface 10*b*) of the semiconductor substrate 10*k*. It is particularly disposed adjacent to the photo-electric conversion layer 50*rk*, in terms of a direction along the photo-electric conversion layer 70*gk*. The photo-electric conversion layer 50*bk* is, for example, a photodiode, and includes a P type layer and an N type layer. An inorganic material of a color filter (first filter) 20*rk* is disposed on the back surface 10*kb* of the semiconductor substrate 10*k*, in particular, between the photo-electric conversion layer 70*gk* and the photo-electric conversion layer 50*rk*. An inorganic material of a color filter (second filter) 20*bk* is disposed on the back surface 10*kb* of the semiconductor substrate 10*k*, in particular, between the photo-electric conversion layer 70*gk* and the photo-electric conversion layer 50*bk*.

The semiconductor substrate 10*k* can be obtained by preparing, for example, an SOI substrate, and grinding the back surface of the SOI substrate until the buried oxide layer is exposed. In this case, the photo-electric conversion layer to become the photo-electric conversion layer 50*rk* and the photo-electric conversion layer 50*bk* may be formed in the semiconductor substrate 10*k* before the grinding or may be formed in the semiconductor substrate 10*k* after the grinding. This photo-electric conversion layer is divided into the photo-electric conversion layer 50*rk* and the photo-electric conversion layer 50*bk* by a groove formed at a region where an insulation member 42*k* is scheduled to be buried in the semiconductor substrate 10*k*. By filling the groove with an insulation material, the insulation member 42*k* is formed. Subsequently, contact holes allowing the back surface of the storage diode 11*g* to be exposed are formed, and then filled with a conductive material, so that contact plugs 82*gk* are formed. Further, by using an attaching method, the respective photo-electric conversion layers and the respective color filters are attached to the back surface 10*kb* of the semiconductor substrate 10*k*. Through these processes, the solid state imaging device 1*k* can be manufactured.

In this solid state imaging device 1*k*, the photo-electric conversion layer 70*gk* is made of an organic material. However, the color filter 20*rk* and the color filter 20*bk* on the semiconductor substrate 10*k* side are made of an inorganic material, and the photo-electric conversion layer 50*rk* and the photo-electric conversion layer 50*bk* on that side are made of an inorganic material. That is, all the respective films disposed between the pixel electrode film 61*gk* and the semiconductor substrate 10*k* are made of an inorganic material. Accordingly, when forming the contact plugs 82*gk* that electrically connect the storage diodes 11*g* to the pixel electrode films 61*gk* for collecting an electric charge in the photo-electric conversion layer 70*gk*, it may be possible to form contact holes passing through inorganic material films without passing through organic material films. In this case, since the photo-electric conversion layer 50*rk* and the photo-electric conversion layer 50*bk* are made of an inorganic material (silicon), microfabrication processing can be used, and this allows a small width of insulation member 42*k* which is disposed between the photo-electric conversion layer 50*rk* and the photo-electric conversion layer 50*bk* and through which contact holes are scheduled to be formed. Furthermore, since the color filter 20*rk* and the color filter 20*bk* are made of an inorganic material, use of microfabrication processing is not problematic and it may be possible to reduce the dimension of contact holes passing through the laminate structures (structures similar to the laminate structures SST shown in FIG. 3C) to serve as the color filter 20*rk* and the color filter 20*bk*. Therefore, according to this exemplary modification, it may be possible to provide solid state imaging device 1*k* having a structure that is advantageous to microfabrication processings and that includes a plurality of laminated photo-electric conversion layers 50*rk*, 50*bk*, and 70*gk*.

According to this exemplary modification, when the semiconductor substrate 10k includes the photo-electric conversion layer(photodiode) 50rk and the photo-electric conversion layer(photodiode) 50bk formed therein, it may be possible to easily reduce the distance between the color filter 20rk (or 20bk) and the photo-electric conversion layer(photodiode) 50rk (or 50bk), and accordingly it may be possible to introduce a sufficient amount of light that is required to satisfy the light receiving sensitivity, to the photo-electric conversion layers(photodiodes) 50rk and 50bk without use of microlenses.

In addition, when the color filters 20rk and 20bk are formed thick, it may be possible to easily suppress the mixing of colors attributable to obliquely incident light that enters the back surface 10kb of the semiconductor substrate 10k at an acute angle to the normal line of the back surface 10kb.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid state imaging device comprising:
    a first photoelectric conversion layer of an organic material, the first photoelectric conversion layer photoelectrically-converting a light of a first color;
    a second photoelectric conversion layer of an inorganic material;
    a third photoelectric conversion layer of an inorganic material, the third photoelectric conversion layer being disposed adjacent to the second photoelectric conversion layer in terms of a direction along the first photoelectric conversion layer;
    a first filter of an inorganic material, the first filter being disposed between the first photoelectric conversion layer and the second photoelectric conversion layer to selectively guide a light of a second color, out of a light that passed through the first photoelectric conversion layer, to the second photoelectric conversion layer; and
    a second filter of an inorganic material, the second filter being disposed between the first photoelectric conversion layer and the third photoelectric conversion layer to selectively guide a light of a third color, out of the light that passed through the first photoelectric conversion layer, to the third photoelectric conversion layer.

2. The device according to claim 1,
    wherein each of the first and second filters is structured in such a manner that a first insulation layer and a second insulation layer are alternately laminated a plurality of times, the second insulation layer having a refractive index larger than that of the first insulation layer.

3. The device according to claim 2,
    wherein each of the first and second filters includes the first insulation layer serving as a spacer layer, and
    wherein the spacer layers of the first and second filters are different in thickness from each other, and
    the corresponding insulations layers excluding the spacer layers of the first and second filters are equal in thickness to each other.

4. The device according to claim 3,
    wherein the first insulation layer is formed with use of a material containing titanium oxide as a main component, and
    wherein the second insulation layer is formed with use of a material containing silicon oxide as a main component.

5. The device according to claim 3,
    wherein the upper surfaces of the first and second filters are different in height from a semiconductor substrate, and
    wherein the solid state imaging device further comprises an organic insulation film covering one filter out of the first and second filters, the one filter having the upper surface being lower in height from the semiconductor substrate than the upper surface of the other filter.

6. The device according to claim 2,
    wherein the first insulation layers of the first and second filters are different in thickness and the second insulation layers of the first and second filters are different in thickness.

7. The device according to claim 6,
    wherein the first insulation layer is formed with use of a material containing silicon oxide as a main component, and
    wherein the second insulation layer is formed with use of silicon nitride as a main component.

8. The device according to claim 1,
    wherein each of the first and second filters is structured such that quantum dots are formed in an insulation film, and
    wherein the quantum dots of the first and second filters are different in diameter from each other.

9. The device according to claim 8,
    wherein the insulation film is made of a material containing silicon oxide as a main component, and
    wherein quantum dots are made of a material containing silicon as a main component.

10. The device according to claim 1, wherein each of the second and third photoelectric conversion layers is made of a material containing, as a main component, a component selected from the group consisting of silicon, cadmium sulfide, cadmium selenide, lead sulfide, and lead selenide.

11. The device according to claim 10,
    wherein each of the second and third photoelectric conversion layers is a momocrystalline, polycrystalline, or amorphous layer of the material.

12. The device according to claim 1,
    wherein the second and third photoelectric conversion films are made of the same material.

13. The device according to claim 12,
    wherein each of the second and third photoelectric conversion layers is made of an inorganic material having a property of absorbing a light of wavelengths in a whole wavelength range of visible light.

14. The device according to claim 1,
    wherein the second and third photoelectric conversion layers are photodiodes including a P type layer and an N type layer, respectively.

15. The device according to claim 1, further comprising:
    pixel electrode films disposed between the first photoelectric conversion layer and the second photoelectric conversion layer and between the first photoelectric conversion layer and the third photoelectric conversion layer, respectively, so as to be covered with the first photoelectric conversion layer, and
    plugs extending from the pixel electrode films via the first and second filters toward a semiconductor substrate.

16. The device according to claim 14, further comprising:
a second insulation film extending between the first photoelectric conversion layer and a plug and between the second photoelectric conversion layer and a plug,
wherein the plugs extends via the second insulation film between the first and second photoelectric conversion layers toward the semiconductor substrate.

17. The device according to claim 1, further comprising:
a semiconductor substrate including a front surface with an active region disposed therein and a back surface at which a buried oxide layer is exposed to the outside,
wherein the first photoelectric conversion layer is disposed on a side of the back surface of the semiconductor substrate,
wherein the second photoelectric conversion layer is disposed between the first photoelectric conversion layer and the semiconductor substrate,
wherein the third photoelectric conversion layer is disposed adjacent to the second photoelectric conversion layer in terms of a direction along the first photoelectric conversion layer, and is disposed between the first photoelectric conversion layer and the semiconductor substrate,
wherein the first filter is disposed on the side of the back surface of the semiconductor substrate between the first photoelectric conversion layer and the second photoelectric conversion layer, and
wherein the second filter is disposed on the side of the back surface of the semiconductor substrate between the first photoelectric conversion layer and the third photoelectric conversion layer.

18. The device according to claim 17, further comprising:
pixel electrode films disposed between the first photoelectric conversion layer and the second photoelectric conversion layer and between the first photoelectric conversion layer and the third photoelectric conversion layer, respectively, so as to be covered with the first photoelectric conversion layer;
an insulation film of an inorganic material, the insulation film being disposed between the second photoelectric conversion layer and the second photoelectric conversion layer; and
plugs extending from the pixel electrode film through between the insulation film and the buried oxide layer to the active region.

19. The device according to claim 1,
wherein the first photoelectric conversion layer is disposed on a side of the back surface of an inorganic semiconductor substrate,
wherein the second photoelectric conversion layer is disposed in at least a first back surface portion within the semiconductor substrate,
wherein the third photoelectric conversion layer is disposed adjacent to the second photoelectric conversion layer in terms of a direction along the first photoelectric conversion layer and disposed in at least a second back surface portion within the semiconductor substrate,
wherein the first filter is disposed on the side of the back surface of the semiconductor substrate between the first photoelectric conversion layer and the second photoelectric conversion layer, and
wherein the second filter is disposed on the side of the back surface of the semiconductor substrate between the first photoelectric conversion layer and the third photoelectric conversion layer.

20. The device according to claim 19, further comprising:
pixel electrode films disposed between the first photoelectric conversion layer and the second photoelectric conversion layer and between the first photoelectric conversion layer and the third photoelectric conversion layer, respectively;
an insulation member of an inorganic material, the insulation member being disposed between the second photoelectric conversion layer and the third photoelectric conversion layer within the semiconductor substrate;
a semiconductor region disposed on a side of a front surface of the insulation member within the semiconductor substrate; and
plugs extending from the pixel electrode film via between the first filter and the second filter through the insulation member to the semiconductor region.

* * * * *